United States Patent [19]
Salmon

[11] Patent Number: 5,490,109
[45] Date of Patent: Feb. 6, 1996

[54] METHOD AND APPARATUS FOR PREVENTING OVER-ERASURE OF FLASH EEPROM MEMORY DEVICES

[75] Inventor: Joseph H. Salmon, Placerville, Calif.

[73] Assignee: Intel Corporation, Santa Clara, Calif.

[21] Appl. No.: 267,472

[22] Filed: Jun. 28, 1994

[51] Int. Cl.$^6$ .................................................. G11C 11/34
[52] U.S. Cl. ................ 365/185.17; 365/201; 365/185.33
[58] Field of Search ..................................... 365/185, 218, 365/900, 201, 184, 104, 189.08

[56] References Cited

U.S. PATENT DOCUMENTS

| | | | |
|---|---|---|---|
| 5,237,535 | 8/1993 | Mielke et al. | 365/218 |
| 5,327,383 | 7/1994 | Merchant et al. | 365/218 |
| 5,335,198 | 8/1994 | Van Buskirk et al. | 365/185 |
| 5,359,558 | 10/1994 | Chang et al. | 365/185 X |

*Primary Examiner*—Joseph A. Popek
*Attorney, Agent, or Firm*—Blakely, Sokoloff, Taylor & Zafman

[57] ABSTRACT

An arrangement for controlling the application of erase biasing voltages to the memory devices of a flash EEPROM memory array which arrangement precludes application of any erase biasing voltage until all of the devices are tested to determine which if any devices are programmed, and then allows application of erase bias voltages only to those blocks of the memory array which include devices which are programmed. In one embodiment, a power-on state machine which is used to read the state of the devices to initialize the array is used to test the condition of the array whenever an erase is desired and latching means are used with each block to preclude any erasing until it is determined that the block, in fact, includes programmed devices.

11 Claims, 5 Drawing Sheets

FIG_2

FIG_4

METHOD AND APPARATUS FOR PREVENTING OVER-ERASURE OF FLASH EEPROM MEMORY DEVICES

BACKGROUND OF THE INVENTION

1. Field of the Invention

This invention relates to computer systems, and more particularly, to methods and apparatus for preventing the over-erasure of individual flash electrically-erasable programmable read only memory (EEPROM) devices in an arrangement including a plurality of arrays of such devices.

2. History of the Prior Art

Flash EEPROM devices are being used for many purposes in present day digital circuits such as computers because of their ability to retain data when power is removed and to be easily reprogrammed. A flash EEPROM memory array is comprised of floating gate field effect transistor devices. By programming, the charge stored on the floating gate of such memory transistors may be changed, and the condition (programmed or erased) may be detected by sensing the devices (cells). Because of their usefulness, flash EEPROM devices are even being used as substitutes for long term memory such as electro-magnetic disk drives. Such an array provides a smaller lighter functional equivalent of a hard disk drive which operates more rapidly and is not as sensitive to physical damage. Such memory arrays are especially useful in portable computers where space is at a premium and weight is important.

Flash EEPROM memory arrays do exhibit problems, however. One such problem which has been discovered is that they can be over-erased, a condition in which the devices cannot be shut off with conventional drive signals. The conventional method of erasing an array of N type flash EEPROM memory cells erases some large block of the cells together. Typically, this requires the application of twelve volts to the source terminals of all of the memory cells in the block, while grounding the gate terminals and floating the drain terminals. A N type flash EEPROM device which has been erased has few electrons on the floating gate, has a low threshold voltage Vt, and consequently transfers current when a relatively low level of gate voltage (e.g., 2–3 volts) is applied. If a device has been over-erased, however, even application of a zero voltage level at the gate terminal may be insufficient to stop current flow. Devices which cannot be shut off can in conventional memory arrangements, cause the memory array to provide incorrect output data when sensed.

When a very large number of flash EEPROM devices are utilized as in a long term memory array meant to supplant an electro-magnetic hard disk drive, then circuitry may be provided for assuring that over-erasing does not occur. Typically this circuitry is complex and requires a substantial amount of die space. For example, some flash memory arrays utilize very complicated state machines to control all aspects of programing and erasing the flash EEPROM devices so that each of these operations is very precisely controlled.

There are may arrangements using smaller flash EEPROM memory arrays with which it is not economically feasible to provide the circuitry used with large long term flash EEPROM memory arrays to assure that over-erasing does not occur. For example, field programmable gate arrays may utilize a number of small flash EEPROM memory arrays to provide initial conditions which define the logic operations provided by such gate arrays. Usually, these flash EEPROM memory arrays are programmed and erased by a user only when setting up the initial conditions or when providing new initial conditions, very infrequently occurring operations; and the initial conditions which are set up usually remain constant once the array goes into use, typically for the life of the part. Since the states of these flash EEPROM devices are normally changed so infrequently, it is not feasible to provide circuitry for precluding over-erasing which may occur only a few times in the life of the device. On the other hand, in arrangements including a large number of small flash EEPROM memory arrays, the physical structure of the devices from one flash EEPROM memory array to the next is likely to vary sufficiently that over-erasing of devices in some arrays may occur while devices in other arrays are still erasing. Moreover, the propensity of users to over-erase flash EEPROM arrays seems to be much greater than might be expected. It is, therefore, desirable to provide arrangements for protecting against over-erasing devices in flash EEPROM memory arrays where the typical circuitry protecting against such over-erasing is not available.

SUMMARY OF THE INVENTION

It is, therefore, an object of the present invention to provide means for protecting against the tendency to over-erase flash EEPROM memory array circuitry.

It is another more specific object of the present invention to provide circuitry for eliminating the ability of a circuit including a plurality of flash EEPROM memory arrays to over-erase devices within any of the arrays.

It is another object of the present invention to provide means for protecting against the tendencies of users to over-erase devices in flash EEPROM memory array circuitry.

These and other objects of the present invention are realized in an arrangement for controlling the application of erase biasing voltages to the memory devices of a flash EEPROM memory array which arrangement precludes application of any erase biasing voltage until all of the devices are tested to determine which if any devices are already erased, and then allows application of erase bias voltages only to those blocks of the memory array which include devices which are programmed. In one embodiment, a power-on state machine which is used to read the state of the devices to initialize the array is used to test the condition of the array whenever an erase is desired and latching means are used with each block to preclude any erasing until it is determined that the block, in fact, includes programmed devices.

These and other objects and features of the invention will be better understood by reference to the detailed description which follows taken together with the drawings in which like elements are referred to by like designations throughout the several views.

Notation And Nomenclature

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
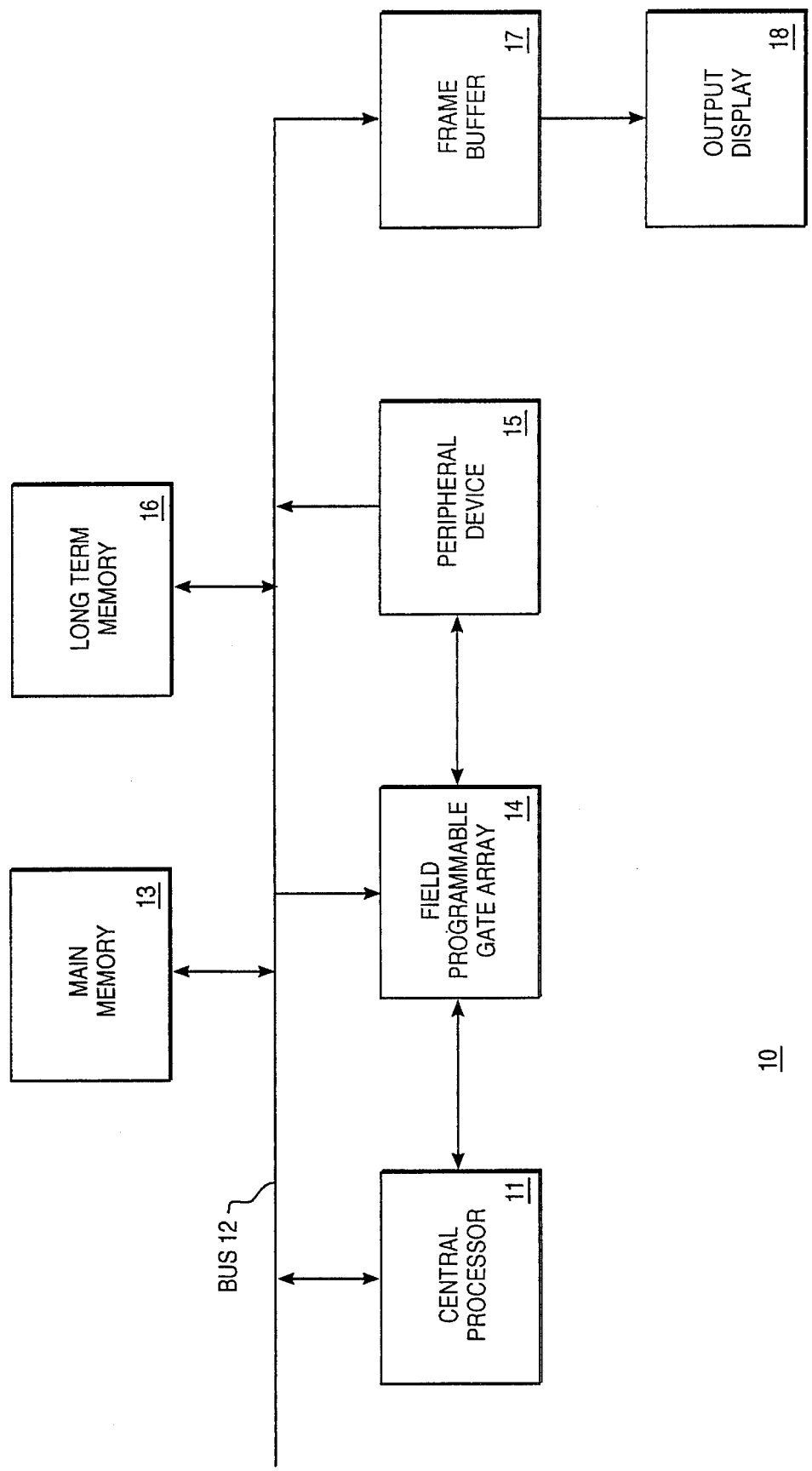
FIG. 1 is a block diagram of a digital system which may utilize the present invention.

Referring now to FIG. 1, there is illustrated a computer system 10. The system 10 includes a central processing unit 11 which executes the various instructions provided to the computer system 10 to control its operations. The central processing unit 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also connected to the bus 12 are various peripheral components such as long term memory 16 and circuitry such as a frame buffer 17 to which data may be written which is to be transferred to an output device such as a monitor 18 for display.

Also joined to the bus 12 is field programmable gate array 14 which may utilize arrays of flash EEPROM memory cells adapted to be programmed to define the logic functions desired for the gate array. Such a gate array may, for example, be utilized to provide a dram memory controller by which the central processing unit 11 may control the operation of main memory 13. In order to illustrate the variety of possible uses of the field programmable gate array 14, it is shown in FIG. 1 connecting the central processing unit 11 to a generalized peripheral device 15 to allow the processing unit 11 to control the peripheral device 15. Moreover, even though the present invention is described in the context of a field programmable gate array, the invention may be utilized in digital systems using flash EEPROM memory arrays in other contexts to protect against over-erasing devices in such memory arrays.

A flash EEPROM memory array has memory cells which are floating gate field effect transistor devices. Such memory transistor devices may be programmed by changing the charge stored on the floating gate, and the condition (programmed or erased) may be detected by sensing the cells. Typically, all of the cells of some large block of an array of flash EEPROM memory cells are erased together. One conventional method requires the application of twelve volts to the source terminals of all of the memory cells, grounding the gate terminals, and floating the drain terminals.

Figure 2:
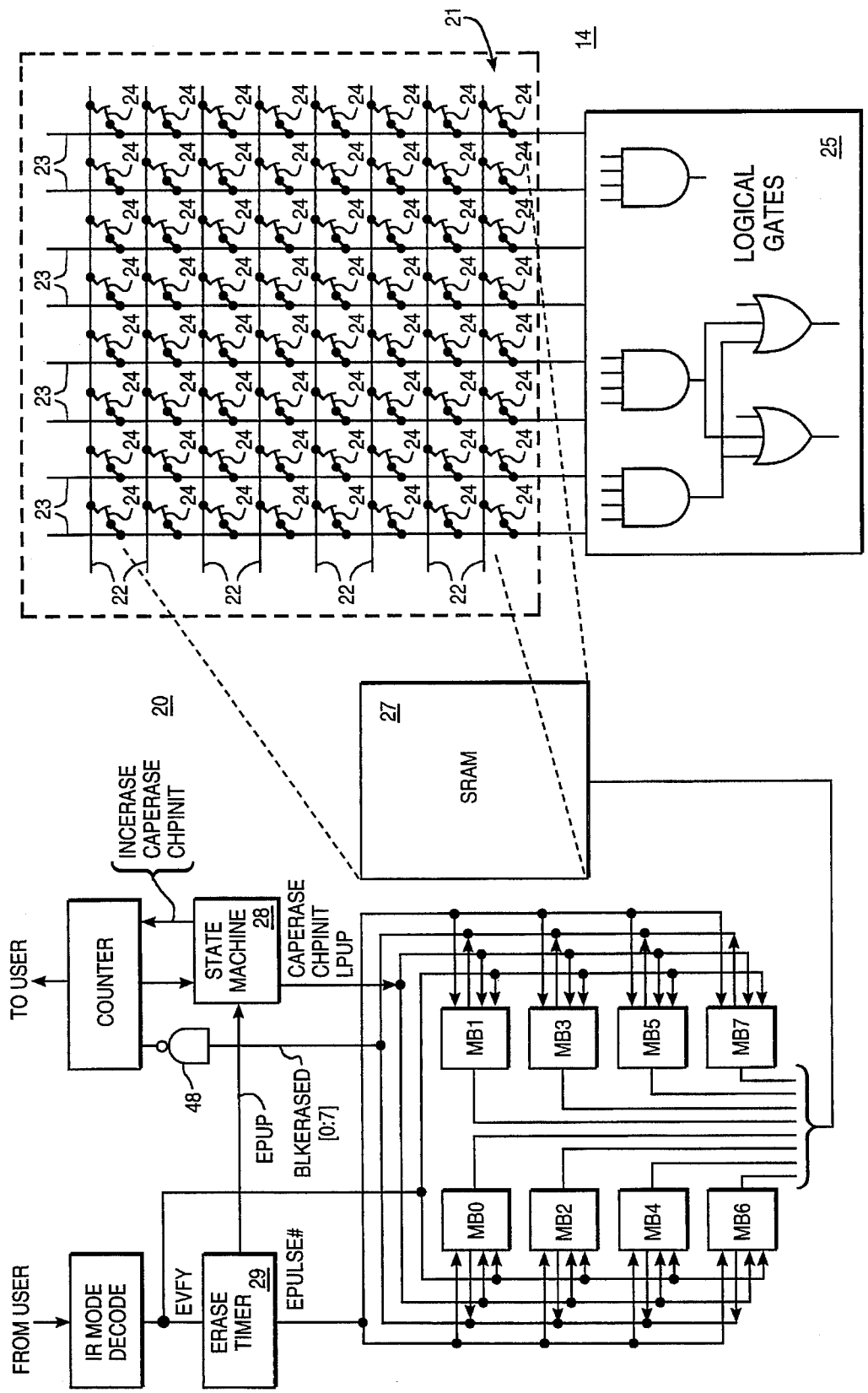
FIG. 2 is a block diagram of a field programmable gate array which may utilize the present invention.

Because field programmable gate arrays (FPGAs) provide one use for a plurality of small flash EEPROM memory arrays, these gate arrays have demonstrated certain problems which can occur with flash EEPROM used for non-volatile code storage. FIG. 2 is a block diagram which illustrates in broad detail a field programmable gate array 20 including a plurality of blocks MB0-7 of flash EEPROM memory arrays.

The gate array 20 includes a switch matrix 21 which includes a large plurality of input conductors 22 usually connected to a smaller plurality of output conductors 23. The output conductors of the switch matrix 21 are connected to various AND gates, and the outputs of the AND gates (product terms) are connected to various OR gates in a gate array portion 25. This arrangement allows the input signals appearing on the conductors 22 to be manipulated in accordance with a particular Boolean function which is the sum of the product terms produced by the AND gates and to be furnished at the output of any OR gate. The Boolean output function provided at the output of each of the OR gates is programmable by a user by programming the connections to be made by the switching devices 24 between the input conductors 22 and the output conductors 23 of the switch matrix using devices such as flash EEPROM cells.

In one embodiment (illustrated in FIG. 2), flash EEPROM devices arranged in a plurality of small memory blocks MB0-7 have been used to provide initial conditions for static random access memory (SRAM) devices as in a memory array 27 which control the actual connections (illustrated by switches 24) between the input and output conductors of the switching matrix by which the logic functions are implemented. The flash EEPROM devices in the memory blocks MB0-7 are programmed by the user to select the desired connections. Often these connections have to be changed. When this occurs, the flash EEPROM devices are erased and reprogrammed.

In FIG. 2, the plurality of memory blocks MB0-7 each of which may include a plurality of rows and columns of flash EEPROM memory devices is illustrated. Each of the blocks MB0-7 is connected to receive input signals from and transfer output signals to a power-on state machine 28. The state machine 28 is typically enabled only when power is applied to the circuit 20 and has among its functions, reading the condition of the flash EEPROM devices in the blocks MB0-7 and transferring the values stored therein so that those values may be used to condition the switches of the static random access memory array 27. In order to accomplish this, the state machine 28 reads, one after another, each row of all of the blocks MB0-7. The signals indicating the values stored in the blocks MB0-7 are transferred to the SRAM array 27 to initialize the devices of that array.

In order to allow erasing the blocks MB0-7, the arrangement also includes a pulse timer circuit 29 which provides an output signal of a duration selected to provide a correct pulse length to the individual memory arrays of the blocks MB0-7 for accomplishing an erase operation of the memory array. In one embodiment, all of the memory blocks MB0-7 receive such a pulse in parallel. An IR mode decode circuit (which in one embodiment is a portion of test circuitry well known to the prior art which conforms to the IEEE JTAG 1149.1 standard for boundary scan circuitry) is utilized to transfer a signal from a user by means of a serial programming arrangement. Such a signal indicates that the programmable gate array 20 is to have its flash memory blocks erased. The user input signal is transferred to the pulse timer circuit 29 which modulates the user signal to assure that the pulse is of the correct length so that the arrays are not over-erased. In one embodiment, the pulse is ten milliseconds in length.

Normally, a field programable gate array is manufactured with the switching devices in place between the possible connections of rows of input conductors and columns of output conductors; and a user programs the flash EEPROM devices which control the switching devices necessary to provide the proper connections for the logical functions the user desires.

Since a user typically programs the functions he desires, the user must provide the appropriate signals for programming the devices of the flash EEPROM array. Typically some form of serial channel for programming and erasing the devices has been provided in field programmable gate arrays to allow this to be accomplished. In certain embodiments, test circuitry which conforms to the IEEE JTAG 1149.1 standard for boundary scan test circuitry has been utilized for this purpose because it provides very simple apparatus already available on an integrated circuit chip by which serial programming may be accomplished by a user. However, the circuitry shown as an IR mode decode circuit could be any circuitry for transferring a pulse to indicate the start of an erase operation. Other means of serial programming have been provided and will be obvious to those skilled in the art.

One major problem which the manufacturers have faced is that in circuitry including a number of small flash EEPROM arrays such as that used in field programmable gate arrays, the process characteristics for the flash devices may differ sufficiently across a die that devices in one block of a flash EEPROM memory array may require different erase values than do devices in other blocks of the array. This may cause devices in some blocks to be over-erasing while devices in other blocks have not yet completed the erase process. In addition, another problem in providing field programable devices is that being field programmable, the devices are subject to the errors of programming and erasure which may be created by the user utilizing these simple means of programing and erasing which do not include control circuitry for assuring that programming and erasing errors do not occur. Apparently, the operational characteristics of flash EEPROM devices are less well known to users than are the characteristics of other devices because users seem very prone to causing errors which make the devices unusable.

A flash EEPROM device is programmed and erased by applying voltages to its terminals which cause charge to be transferred to and from the floating gate of the device. Typically, a device is selectively placed in the one (non-conductive) or programmed condition by placing approximately twelve volts on the gate terminal, approximately seven volts on the drain terminal, and ground on the source terminal. A device which is programmed has a substantial number of electrons placed on its floating gate. N type devices are erased (placed in a zero or conductive condition) by applying a value such as twelve volts at the source terminals while grounding the gate terminals and floating the drain terminals of all of the devices in a selected portion (block) of an array. It should be noted that an entire block of devices is erased together. When a device is erased, any electrons on the floating gate are tunneled from the floating gate. The condition of a device is read by detecting the charge on the floating gate. This is accomplished by placing approximately five volts on the gate terminal, one volt on the drain terminal, and grounding the source terminal. When a device 22 is functioning within tolerances, the gate-source voltage is greater than the threshold voltage Vt of the erased cells and is less than the threshold voltage Vt of the programmed cells. Thus, a device which has been programmed with a substantial charge on the floating gate conducts very little current while a device which has been erased will conduct a substantial amount of current. The mount of current conducted may be measured by transferring the current produced through a load device and comparing the voltage generated across the load device to a known voltage value using a sense amplifier.

If, when a N type flash EEPROM device is erased, the condition of the charge on the floating gate is forced too low resulting in a threshold voltage Vt of zero or less than zero, then current will flow through the device even though the voltage applied to the gate terminal is at zero (ground) value. Typically, some number of flash EEPROM devices in a row of a block is sensed at once by detecting output values at a plurality of sense amplifiers, each sense amplifier being connected to sense the output from one bitline of the block. In one embodiment, all of the bitlines of a block of the array are sensed at once so that eighty output signals are provided at one time. In order to select the particular row of devices, a gate voltage of approximately five volts is applied to all of the devices in the selected row while the gates of devices in other rows are grounded. This should cause those devices in the selected row which are erased to conduct and those devices in the selected row which are programmed to remain off. All devices in non-selected rows should remain off. However, presuming that very little current is flowing through the off devices in the selected row, if current is flowing through a device in a non-selected row because it has been over-erased, then the current through that non-selected device may cause the output of the sense amplifier to appear as though the selected device in the selected row is operating in response to an input signal. It will be obvious that this will cause incorrect operation of the memory of the field programmable device.

As mentioned above, a large part of the over-erasing problem is caused by variations in the memory devices caused by variations in the manufacturing process. Statistically, some flash EEPROM devices will take longer to erase than will other such devices. In prior art arrangements, some devices might already be erased yet receive additional erasing signals because other devices had not yet completed erasure. This could cause those devices which erased more rapidly than others to over-erase. This is a particularly important problem with a number of small blocks of flash EEPROM devices which have been produced at different positions on the same relatively large die.

In addition to the problem caused by variation in the manufacturing process, it has been found that users also cause over-erasing because they do not understand that a device can be over-erased and placed in a condition where it will operate with an input signal which should disable it and therefore (1) provide more erase pulses than are necessary to erase the device and (2) do not accurately control the length of application of biasing signals to the flash devices. The pulse timer shown in FIG. 2 limits the length of individual pulses but does not eliminate the ability of a user to transfer multiple erase pulses which may over-erase the devices.

The present invention, without requiring the addition of significant circuitry, eliminates a substantial portion of the problem caused by variations in the process by which the flash EEPROM devices are manufactured and eliminates the ability of the user to bring about the user induced over-erasing conditions referred to above.

In addition to the circuitry in FIG. 2 previously discussed, there is also illustrated in block diagram form portions of circuitry designed in accordance with the present invention to preclude these problems. Each of the memory blocks MB0-7 is connected to receive input signals from and transfer output signals to a power-on state machine 28. As explained, the state machine has among its functions, providing signals for selecting individual rows of each of the memory arrays MB0-7 and reading out the values stored therein so that those values may be used to condition the switches of the static random access memory array 27. Such a function has been provided, for instance, in the iFX780 series of field programable gate arrays manufactured by Intel Corporation of Santa Clara, Calif. These arrays are described in a publication entitled *iFX780, 10 ns FLEXlogic FPGA FAMILY WITH SRAM OPTION*, published September 1992. When these values are read from each of the rows of each of the blocks using circuitry of the present invention, the outputs of the sense amplifiers are provided to a wired NOR circuit connected to each block. The wired NOR circuit provides a signal for each block which indicates if that row includes any programmed flash EEPROM devices. Each memory array MB0-7 provides these output signals from the output of sense amplifiers (not shown in FIG. 2) to a NAND gate 48 which provides an output signal to a counter circuit associated with the power-on state machine 28. If any of the signals furnished by all sense amplifiers connected to a row of all of the blocks MB0-7 indicates that the row of any block of the array contains any memory devices which are programmed, the counter is incremented by one at INCERASE time. The counter circuit provides an output signal to the user. If the count is zero, the signal indicates that all of the blocks MB0-7 are erased. If the count is anything but zero, the signal indicates that some block still includes programmed flash EEPROM devices; and the user should continue to erase the array.

Figure 3:
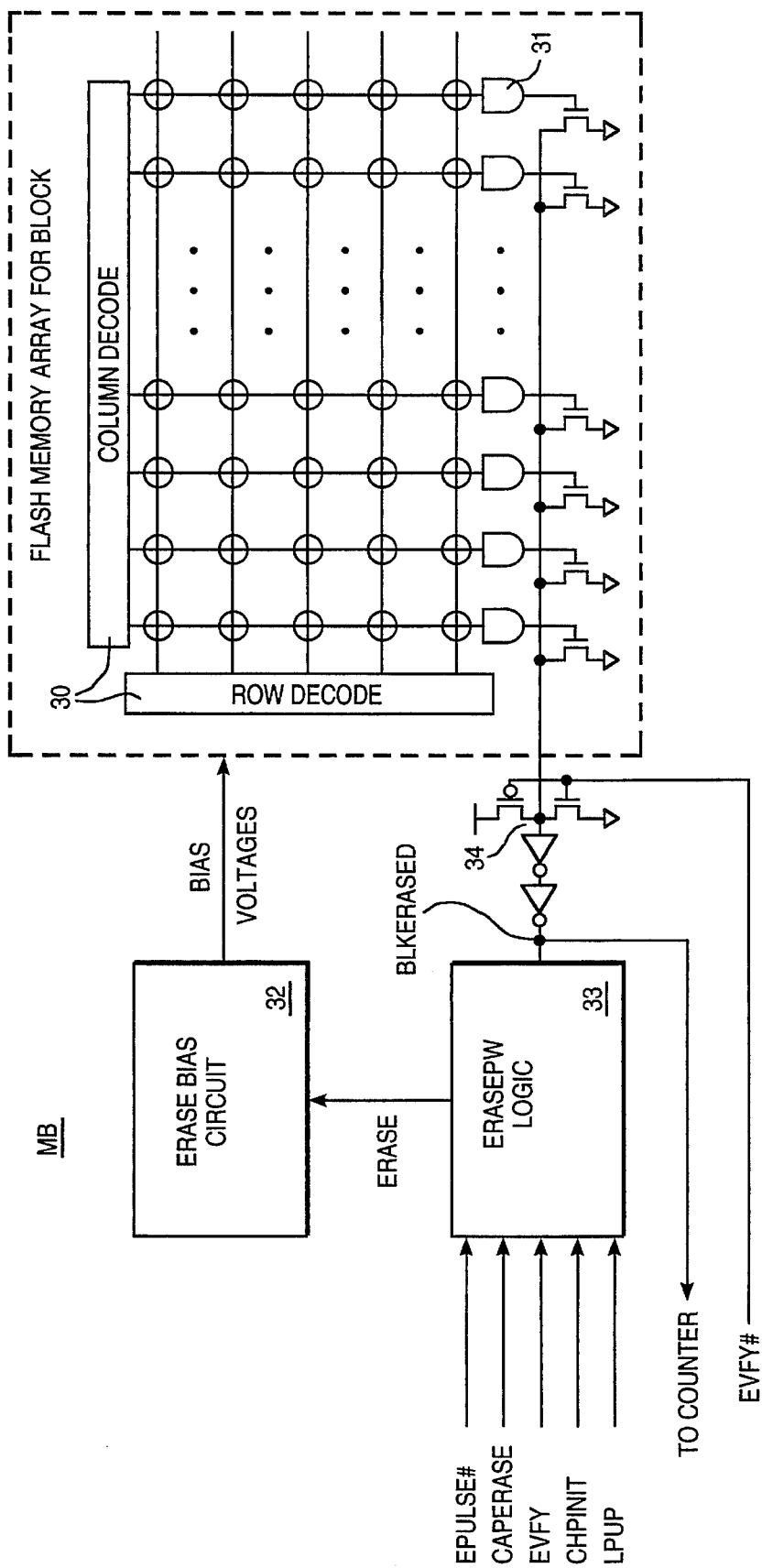
FIG. 3 is a block diagram illustrating a circuit designed in accordance with the present invention.

FIG. 3 is a block diagram of one of the memory blocks MB0-7. Each block includes the physical array of flash EEPROM memory devices including decoding circuitry 30 for addressing the devices, and sense amplifiers 31 for providing output signals from each column of the array. As may be seen, a wired NOR arrangement 34 is connected to the output of all of the sense amplifiers of the particular memory block MB0-7. In one embodiment, each sense amplifier 31 provides a zero value to the gate of a N type output device if the device sensed in that row is not programmed. If all flash EEPROM devices in the block are erased, the N type devices are all off; and the wired NOR circuit 34 furnishes a one value at its output; if a single flash EEPROM device in a row remains programmed, the wired NOR circuit 34 furnishes a zero output signal. These signals are furnished to an erase pulse width logic circuit 33 and to the counter circuit shown in FIG. 2 as a BLKERASE signal.

An erase bias circuit 32 is also provided in each memory block MB0-7 to act as a source for furnishing biasing voltages to the flash EEPROM array for erasing the devices in response to signals from the erase pulse width logic circuit 33. The erase pulse width logic circuit 33 receives input signals including the EPULSE# signal from the erase timer circuit 29, a CAPERASE signal from the power-on state machine 28, an EVFY signal which is generated in response to the input signal from the user initiating the erase of the array, a CHPINIT signal from the power-on state machine 28, and a LPUP signal which is provided at power-on.

Figure 4:
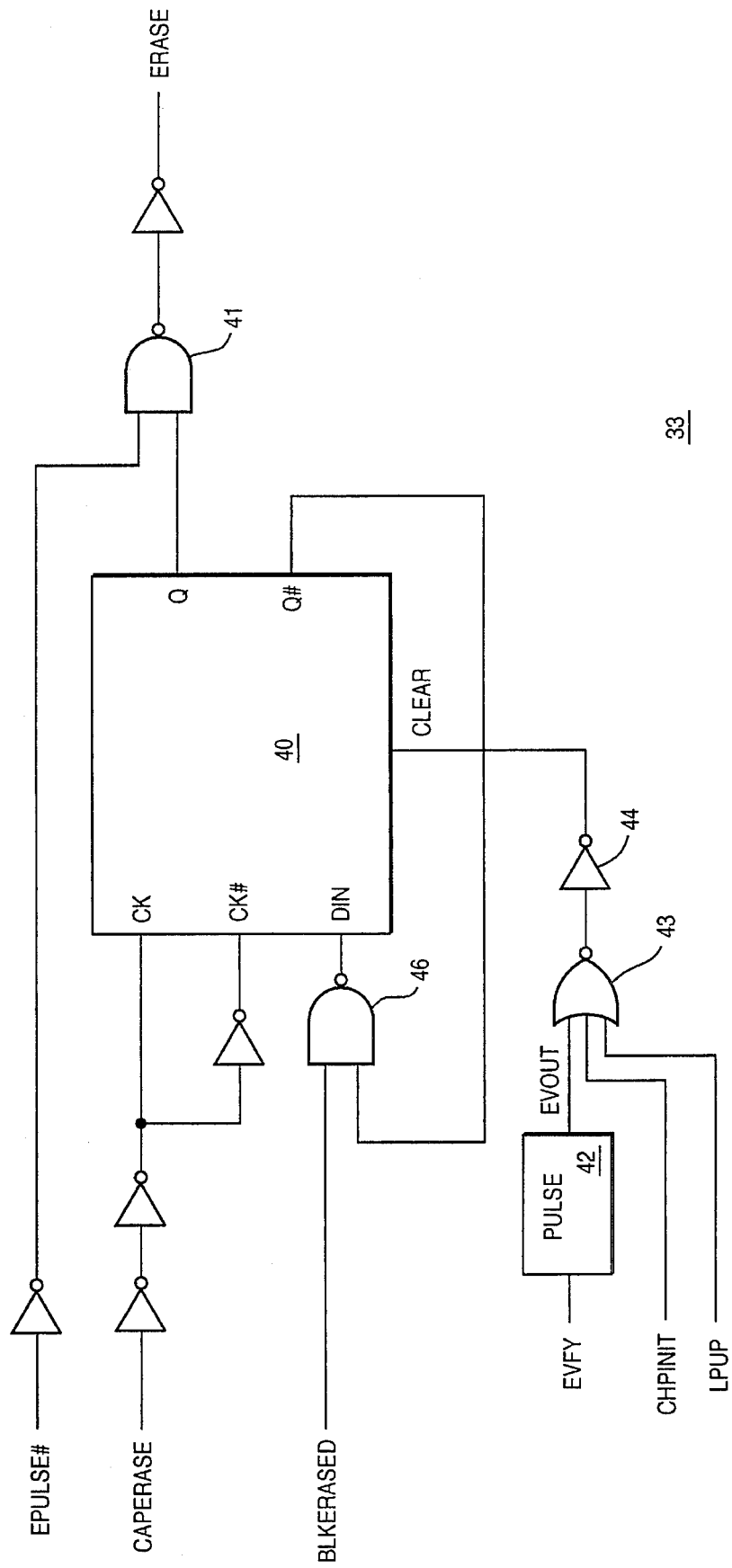
FIG. 4 is a more detailed block diagram of the present invention.

FIG. 4 illustrates in detail the circuitry of the erase pulse width logic circuit 33. The circuit includes a latch circuit 40 which provides an output signal to a NAND gate 41. The NAND gate 41 also receives an input signal EPULSE# provided at the output of the pulse timer circuit 29. The output of the NAND gate 41 is inverted and used to provide the ERASE signal to the erase bias circuit 32 which furnishes erase biasing potentials to the memory array included within the individual one of the memory blocks MB0-7. The NAND gate 41 provides a zero output which is inverted to furnish the one valued erase signal only when both the EPULSE# signal and the latch circuit 40 furnish one values. Consequently, the EPULSE# signal provided by the erase timer circuit 29 is only forwarded to actually erase an array block when the latch circuit 40 furnishes a one valued output signal. It will be appreciated that the NAND gate 41 might be replaced by other circuits known to those skilled in the art which provide a means for creating an output condition in response to the presence of two input conditions.

The condition of the latch 40 is determined by a number of input signals discussed previously including the CAPERASE signal, the EVFY signal, the CHPINIT signal, and the LPUP signal.

When the circuit 20 is first turned on, the power-on state machine 28 generates the LPUP signal. The LPUP signal is transferred by a NOR gate 43 and an inverter 44 to the clear terminal of the latch 40. This signal places the latch 40 in a state where the output at its Q output terminal precludes the transfer of transient conditions by the gate 41. Thus, no extraneous erase pulse can be generated when power is first applied to the circuit 20.

Figure 5:
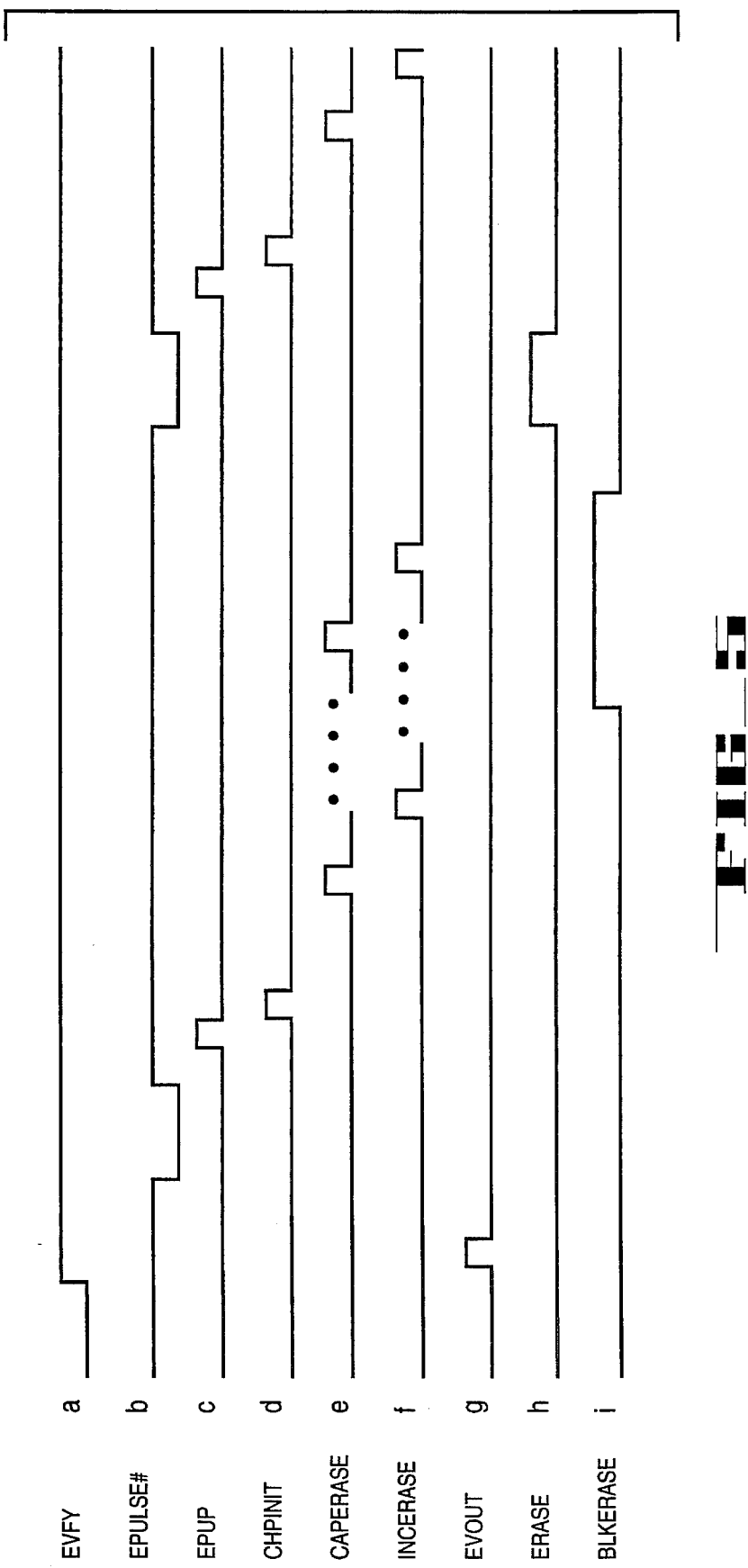
FIG. 5 is a timing diagram illustrating signals used in the circuits of FIGS. 3 and 4.

When an erase operation is desired, an EVFY signal illustrated in FIG. 5 is provided by the user to indicate that the circuit is in the erase mode. The EVFY signal is furnished to a pulse generating circuit 42 which produces a pulse EVOUT of a length sufficient to clear the latch 40. This pulse is transferred by the NOR gate 43 and the inverter 44 to the clear terminal of the latch 40. The pulse also places the latch 40 in a state to provide a zero at its Q output terminal. Shortly after the beginning of the EVFY signal, the erase timer circuit 29 provides an EPULSE# signal of approximately ten milliseconds duration. The state of the latch 40 at its Q output terminal precludes the transfer of the EPULSE# signal by the gate 41. Consequently, the initial EPULSE# signal has no effect on the associated memory block MB0-7. After the end of the EPULSE# signal, the erase timer circuit 29 generates a signal EPUP which is transferred to the power-on state machine 28 to initiate its operation in the erase condition. The power-on state machine 28 responds to the EPUP signal by sensing each of the rows of each of the memory blocks MB0-7.

However, it first generates a CHPINIT signal to assure that the latch 40 is cleared so that an EPULSE signal cannot initiate erasing of the block of memory.

As each row of the blocks MB0-7 is read, the sense amplifiers 31 and the wired NOR arrangement 34 provide an output signal for that row of that block of the array indicating whether that row contains any programmed memory devices. If a row has no programmed devices, then the output for that memory block of the array is a one. The values provided from the wired NOR arrangement 34 for the row being read in each of the blocks MB0-7 is transferred back to the latch 40 of that block as a BLKERASE signal and are also transferred to a NAND gate 48. The BLKERASE signal causes a NAND gate 46 to generate a signal at the DIN terminal of the latch 40 indicating the erased or programmed condition of the row. Once a programmed device is encountered in a row of a block, the output produced at the Q output terminal of the latch 40 places the gate 41 in a condition to transfer the EPULSE# signals to the erase bias circuit 32 as the ERASE signal. In addition, the Q# output terminal of the latch 40 provides a feedback signal to the gate 46 to assure that the latch 40 remains in the same condition during the reading of all of the rows of the block no matter what the output of the wired NOR gate 34 for the succeeding rows.

The BLKERASE signal is also transferred to a NAND gate 48 shown in FIG. 2. The NAND gate 48 sums the values provided for that row by all of the blocks MB0-7 and provides an output to the counter which is latched in response to the CAPERASE signal. The NAND gate 48 provides a zero output to the counter circuit if all of the memory blocks are erased. If any row of any block includes programmed devices, the output is a one indicating that additional erasing is required. The count is first stored at the input by the counter, and a stored one value causes the counter to increment in response to a clock signal INCERASE from the power-on state machine 28.

The process by which a flash EEPROM array is erased requires that all of the devices first be placed in the programmed condition. It has been possible for a user to presume a block is programmed and proceed to erase the block thereby over-erasing the block. Since the first time the memory array is carrying out the erase process, a pulse caused by the EVFY signal will have placed the latch 40 in a condition so that the EPULSE signal cannot be transferred to erase the array block, a user cannot inadvertently erase (over-erase) an array which is already erased. However, the BLKERASE pulse generated at the output of the wired NOR arrangement 34 is transferred back through the NAND gate 46 to the DIN terminal of the latch 40 to set the latch if any flash devices in that block are in the programmed state. The BLKERASE signal is docked into the latch 40 by the CAPERASE signal from the state machine 28. As may be seen in FIG. 5, as each row of the array is read, the BLKERASE signal is docked to the latch 40 so that any programmed device will cause the latch 40 to be set. If the BLKERASE signal is in a zero condition (because programmed devices exist in the row read) to set the latch 40, the latch state allows the next EPULSE# signal (initiated by the user in response to the output signal from the counter) to be transferred to erase that particular block of memory. As pointed out above, the Q# output terminal of the latch 40 provides a feedback signal to the gate 46 to assure that the latch 40 remains in the same condition during the reading of all of the rows of the block no matter what the output of the wired NOR gate 34 for the succeeding rows. After the next EPULSE# signal, the read of memory is again begun in response to the EPUP signal and another series of BLKERASE signals are generated. If the block is still not erased after the erase pulse, the BLKERASE signal again causes the latch 40 to be set to allow the subsequent EPULSE# signals to transit the gate 41 so that the block continues to be erased. If all of the cells in each row of the block have been erased, then the BLKERASE signal will be a one; and the latch 40 will remain in a condition in which its output blocks the transfer of the EPULSE# signal to the particular memory block.

The effect of this arrangement is that since all memory blocks are normally erased in parallel on a row by row basis, only those blocks which have programmed cells will transfer the erase pulse EPULSE# to the memory block as an ERASE signal to accomplish a further erase of the block. Consequently, blocks of cells which erase more rapidly than do cells in other blocks and have already reached the erased condition are not subject to additional erase pulses which might place them in the over-erased condition. Furthermore, if a user attempts to provide additional erase pulses to an already erased array, the condition of the latch will preclude the signals EPULSE# from being applied to the array. Consequently, the main problems which can occur due to over-erasing are eliminated.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A programmable gate array comprising:

a switching matrix having input and output conductors which may be joined to one another at selected intersections;

a plurality of AND and OR gates for providing output signals depending on the input and output conductors of the switching matrix which are connected; and a memory array having flash EEPROM memory devices for controlling the connection of the input and output conductors of the switching matrix, the memory array comprising:

a circuit arrangement for controlling the application of erase biasing voltages from a source of biasing voltages to the flash EEPROM memory devices of the memory array comprising:

an erase signal source for initiating a signal to cause the application of biasing voltages by the source of biasing voltages, a state machine for providing a series of signals for reading the flash EEPROM memory array, decode circuitry responding to the state machine for sequentially reading rows of flash EEPROM memory devices, an output circuit for providing a signal indicating whether any flash EEPROM memory device in a row of the block of the memory array which has been read is programmed, storage circuitry for storing a condition produced by a signal from the output circuit and producing an output signal indicate of the condition, and a gate responsive to an output signal from the storage circuit for transferring a pulse from the erase pulse signal source to the source of biasing voltages.

2. A programmable gate array as claimed in claim 1 in which the output circuit comprises:

a plurality of sense amplifiers for detecting the condition of flash EEPROM memory devices in a row being read, and a wired NOR circuit for providing a first output signal indicating when any flash EEPROM memory device being read is programmed and a second output signal

11 indicating that no flash EEPROM memory device being read is programmed.

3. A programmable gate array as claimed in claim 1 further comprising an input gate for providing a signal to the storage circuit depending on a signal from the output circuit and the output signal produced by the storage circuit.

4. A programmable gate array as claimed in claim 1 in which the memory array comprises a plurality of blocks each including each of:

decode circuitry responding to the state machine for sequentially reading rows of flash EEPROM memory devices, an output circuit for providing a signal indicating whether any flash EEPROM memory device in a row of the block of the memory array which has been read is programmed, storage circuitry for storing a condition produced by a signal from the output circuit and producing an output signal indicate of the condition, and a gate responsive to an output signal from the storage circuit for transferring a pulse from the erase pulse signal source to the source of biasing voltages, and which further comprises a summing circuit responsive to the signals from each output circuit indicating whether any flash EEPROM memory device in a row of a block of the memory array which has been read is programmed for providing a signal to indicate if any flash EEPROM memory device in the memory array has been programmed.

5. A programmable gate array as claimed in claim 4 in which the summing circuit comprises:

a first gating circuit receiving the signals from each output circuit indicating whether any flash EEPROM memory device in a row of a block of the memory array which has been read is programmed, and a circuit for providing a first output signal if no devices are programmed and a second output signal if any flash EEPROM memory device in the memory array has been programmed.

6. A digital system comprising:

a control circuit for carrying out instructions;

a busing circuit joined to the control circuit for transferring signals;

a peripheral device joined to the busing circuit; and a programmable gate array connected to receive signals from the control circuit and provide control signal to the peripheral circuit, the programmable gate array comprising:

a switching matrix having input and output conductors which may be joined to one another at selected intersections;

a plurality of AND and OR gates for providing output signals depending on the input and output conductors of the switching matrix which are connected; and a memory array having flash EEPROM memory devices for controlling the connection of the input and output conductors of the switching matrix, the memory array comprising:

a circuit arrangement for controlling the application of erase biasing voltages from a source of biasing voltages to the flash EEPROM memory devices of the memory array comprising:

an erase signal source for initiating a signal to cause the application of biasing voltages by the source of biasing voltages, a state machine for providing a series of signals for reading the flash EEPROM memory array,

12 decode circuitry responding to the state machine for sequentially reading rows of flash EEPROM memory devices, an output circuit for providing a signal indicating whether any flash EEPROM memory device in a row of the block of the memory array which has been read is programmed, storage circuitry for storing a condition produced by a signal from the output circuit and producing an output signal indicate of the condition, and a gate responsive to an output signal from the storage circuit for transferring a pulse from the erase pulse signal source to the source of biasing voltages.

7. A circuit for protecting from over-erasure of a plurality of programmable and erasable memory devices, said circuit comprising:

a plurality of programmable and erasable memory devices arranged in a plurality of blocks, each block including circuitry for accessing and reading at least a portion of said memory devices to determine whether each memory device in said portion of said memory devices are in a programmed or erased condition;

an erase biasing circuit for each block for providing biasing voltages to erase at least a portion of said memory devices in a respective block in response to an erase signal;

a first logic circuit for each block coupled to said output of said memory devices for detecting whether any memory device in said portion of said memory devices remains in a programmed state;

a latch for each block coupled to said first logic circuit for storing a state to indicate whether at least one memory device in said portion of said memory devices is in a programmed condition; and a second logic circuit for each block coupled to said latch for generating said erase signal when said latch indicates at least one memory device in said portion of memory devices is in a programmed state.

8. The circuit as set forth in claim 7, further comprising:

an AND logic circuit coupled to said first logic circuit for each of said memory blocks; and a counter coupled to said output of said AND logic circuit to indicate to a user that said portion of said memory devices requires further erasure.

9. The circuit as set forth in claim 7, wherein said memory devices are flash electrically erasable programmable read only memory (EEPROM) devices.

10. The circuit as set forth in claim 7, wherein said plurality of memory devices are arranged in an array, and said portion of said memory devices comprises a row of memory devices.

11. A method for protecting a plurality of programmable and erasable memory devices arranged in a plurality of blocks from over-erasure, said method comprising the steps of:

accessing and reading at least a portion of said memory devices to determine whether said portion of said memory devices are in a programmed or erased condition;

detecting, in each block, whether any memory device in said portion of said memory devices remains in a programmed state;

storing a state, for each block, to indicate whether at least one memory device in said portion of said memory devices is in a programmed condition;

generating an erase signal when said state stored for said block indicates at least one memory device in said portion of memory devices is in a programmed state; and biasing for erasure said portion of said memory devices in a respective block in response to said erase signal.

* * * * *

UNITED STATES PATENT AND TRADEMARK OFFICE
CERTIFICATE OF CORRECTION

PATENT NO.    : 5,490,109
DATED         : February 6, 1996
INVENTOR(S)   : Salmon It is certified that error appears in the above-identified patent and that said Letters Patent is hereby corrected as shown below:

In column 1, at line 60, delete "may" and substitute --many--.

In column 6, at line 19, delete "mount" and substitute --amount--.

In column 9, at line 46 and line 49, delete "docked" and substitute --clocked--.

Signed and Sealed this

Thirty-first Day of December, 1996

Attest:

BRUCE LEHMAN

Attesting Officer    Commissioner of Patents and Trademarks